United States Patent
Chen et al.

(10) Patent No.: US 9,020,633 B1
(45) Date of Patent: Apr. 28, 2015

(54) AUTOMATING STORAGE, RETRIEVAL, AND ROUTINE FOR PROCESS FLOW

(71) Applicant: Taiwan Semiconductor Manufacturing Company Ltd., Hsinchu (TW)

(72) Inventors: Yung-Ho Chen, Hsinchu (TW); Chun-Jung Huang, Yunlin County (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

(21) Appl. No.: 14/093,336

(22) Filed: Nov. 29, 2013

(51) Int. Cl.
  *G06F 7/00* (2006.01)
  *G06F 19/00* (2011.01)
  *B65G 1/137* (2006.01)

(52) U.S. Cl.
  CPC .................................... *B65G 1/137* (2013.01)

(58) Field of Classification Search
  None
  See application file for complete search history.

(56) References Cited

U.S. PATENT DOCUMENTS

| | | | |
|---|---|---|---|
| 2007/0127001 A1* | 6/2007 | Van Der Hoeven | 355/53 |
| 2009/0142167 A1* | 6/2009 | Gage et al. | 414/221 |
| 2010/0143082 A1* | 6/2010 | Wang et al. | 414/222.02 |
| 2011/0211825 A1* | 9/2011 | Matsuoka et al. | 396/611 |
| 2012/0046781 A1* | 2/2012 | Kalenian et al. | 700/121 |

* cited by examiner

Primary Examiner — Yolanda Cumbess
(74) Attorney, Agent, or Firm — WPAT, P.C.; Anthony King

(57) ABSTRACT

In some embodiments, an automated storage and retrieval system (ASRS) for storing workpieces includes a main body, a robotic arm mechanism and at least one first station. The workpiece comprises a first container configured to hold at least one article. The main body includes at least one side wall configured to confine a storage space for the workpieces in at least one first direction parallel to a floor. The robotic arm mechanism is configured to reach the storage space, the storage space being further confined by the robotic arm mechanism in at least one second direction opposite to the at least one first direction. The at least one first station is configured with at least one first accessing port located within the storage space, and configured for the ASRS to perform a routine for a process flow.

18 Claims, 8 Drawing Sheets

AUTOMATING STORAGE, RETRIEVAL, AND ROUTINE FOR PROCESS FLOW

TECHNICAL FIELD

The present disclosure is generally related to automating storage, retrieval, and routines for process flow.

BACKGROUND

In manufacturing of a product, the product is processed at many work stations or processing machines. These work stations are usually clustered into process bays. Interbay or Intrabay conveying of work-in-process (WIP) parts or semi-finished products typically involve the use of an automatic guided vehicle (AGV) system, a rail guided vehicle (RGV) system, an overhead transport (OHT) system, and/or human labor. Stockers are usually installed in between process bays or within process bays to, for example, provide a buffering space for the WIP parts between work stations. AGVs, RGVs, OHT vehicles and/or human labor are used to transport the WIP parts between work stations and a stocker. However, waiting time for the AGVs, RGVs, OHT vehicles and/or human labor to pick up or drop off WIP parts at the stocker can be affected by poorly coordinated scheduling of the vehicles and a robotic arm mechanism of the stocker and by traffic condition on a route to or from the stocker and so on and can cause undesirable delays that affect a throughput of the product.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAIL DESCRIPTION

Figure 1:
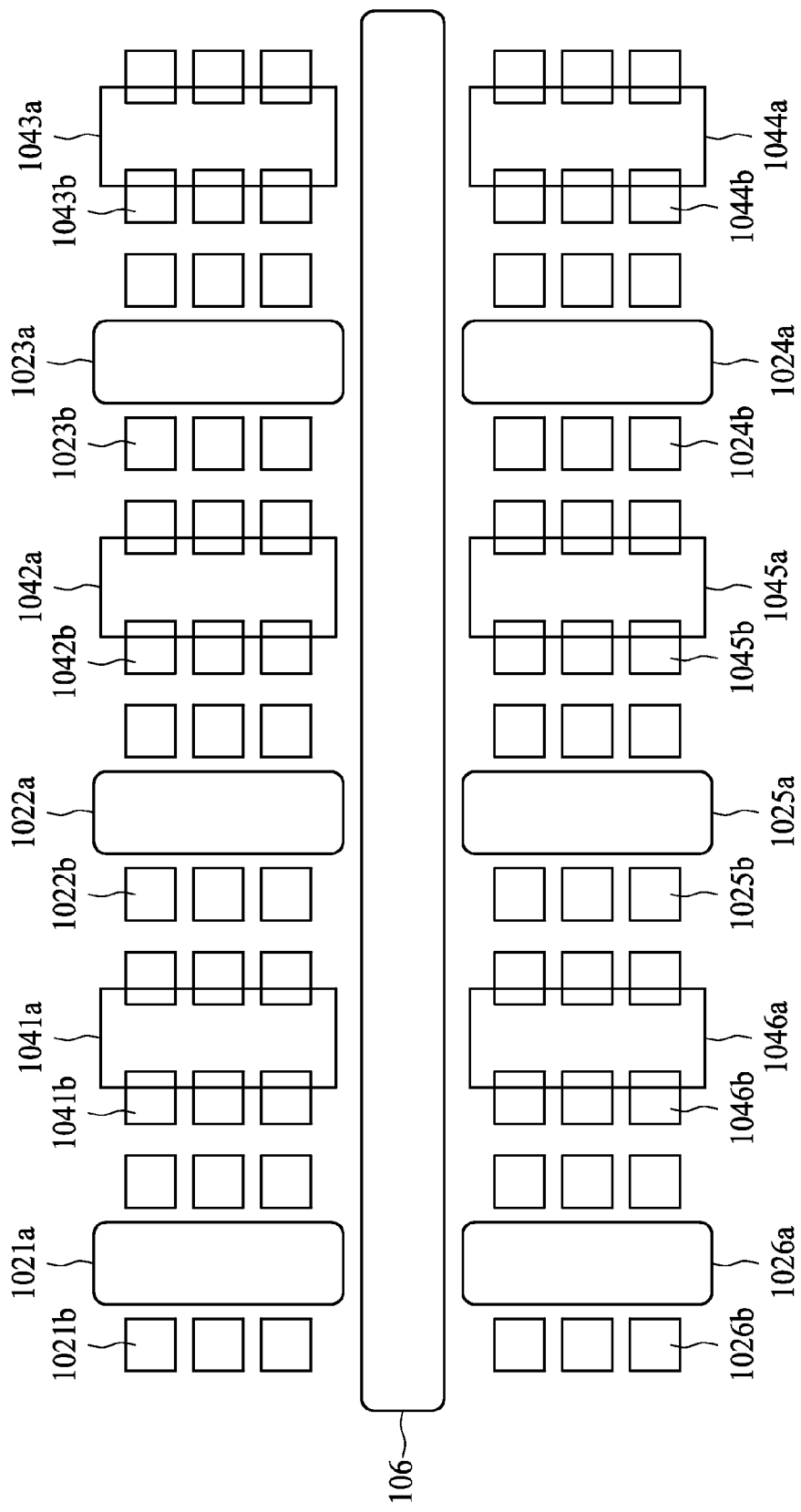
FIG. 1 is a schematic diagram of an automatic material handling system (AMHS) configured with stockers self-contained in performing routines for a process flow in accordance with some embodiments.

Embodiments, or examples, of the disclosure illustrated in the drawings are now described using specific languages. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numbers may be repeated throughout the embodiments, but this does not necessarily require that feature(s) of one embodiment apply to another embodiment, even if they share the same reference number.

Some embodiments have one or a combination of the following features and/or advantages. In some embodiments, a stocker is configured provide integrated automation among storage, retrieval, a metrology or inspection operation and sorting. Therefore, the stocker is self-contained in performing a metrology or inspection routine for a process flow, and wait times for a vehicle to pick up or drop off a workpiece transported between the stocker and a metrology or inspection station, and between the stocker and an interbay transportation system is eliminated. In some embodiments, the metrology or inspection operation is performed on test wafers. In other embodiments, the metrology or inspection operation is performed on prime wafers. In still other embodiments, the metrology or inspection operation is performed on a photomask or reticle.

FIG. 1 is a schematic diagram of an automatic material handling system (AMHS) 10 configured with stockers self-contained in performing routines for a process flow in accordance with some embodiments. In some embodiments, an AMHS 10 is configured to facilitate conveying of a workpiece from one place to another in a manufacturing facility. The worpiece includes a container for holding one or more WIP parts (hereafter articles). The AMHS 10 includes several process bays 1021, 1022, ..., and 1026, several stockers 1041, 1042, ..., and 1046 self-contained in performing a routine for a process flow, and an interbay transportation system 106. Each process bay 1021, 1022, ..., or 1026 is configured to perform a respective type of process operations in the process flow such as photolithography, etching, diffusion, ion implantation, deposition and passivation in a semiconductor device fabrication process flow. Each process bay 1021, 1022, ..., or 1026 includes work stations 1021b, 1022b, ..., or 1026b clustered for the particular type of process operations, and an intrabay transportation system 1021a, 1022a, ..., or 1026a configured to convey the workpiece between the work stations 1021b, 1022b, ..., or 1026b within the process bay 1021, 1022, ..., or 1026. In some embodiments, the intrabay transportation system 1021a, 1022a, ..., or 1026a is an AGV system, an RGV system, or an OHT system. For simplicity, only a guided route, a guided rail or an overhead track of the intrabay transportation system 1021a, 1022a, ..., or 1026a is illustrated in FIG. 1. In some embodiments, the stocker 1041, 1042, ..., or 1046 is configured to provide integrated automation among storage, retrieval and the operations for the stocker 1041, 1042, ..., or 1046 to be self-contained in performing the routine for the process flow. In some embodiments, the stocker 1041, 1042, ..., or 1046 includes a main body 1041a, 1042a, ..., or 1046a that confines a storage space and work stations 1041b, 1042b, ..., or 1046b embedded into the main body 1041a, 1042a, ..., or 1046a. In addition to providing a buffering mechanism between the process bays 1021 and 1022, 1022 and 1023, ..., or 1025 and 1026 the stocker 1041, 1042, ..., or 1046 also performs the routine for the process flow. A routine for a process flow is one operation or a series of operations for achieving a particular purpose for the process flow. For example, a metrology or inspection routine is performed for monitoring and control a processing operation each time before and/or after it is performed in the process flow. A cleaning routine is for cleaning the article each time when the article is moved into a clean environment from an exposed environment in the process flow. A routine for photolithography is performed during each photolithography processing operation in the process flow. The interbay transportation system 106 is configured to convey the workpiece among the process bays 1021, 1022, . . . , and 1026 and the stockers 1041, 1042, . . . , and 1046. In some embodiments, the interbay transportation system 106 is an AGV system, an RGV system, or an OHT system. For simplicity, only a guided route, a guided rail or an overhead track of the interbay transportation system 106 is shown.

In some embodiments, the stocker 1041, 1042, . . . , or 1046 is configured to provide integrated automation among storage, retrieval and the operations for the stocker 1041, 1042, . . . , or 1046 to be self-contained in performing a metrology or inspection routine for a process flow. In the following, the stocker 1041 is taking as an example. Suppose a first workpiece includes a container containing multiple articles. After the articles of the first workpiece are processed by the process bay 1021, the first workpiece is sent to the stocker 1041. After the stocker 1041 performs the metrology and inspection routine, the first workpiece with passing articles are directed to the next process bay 1022 for further processing, and a second workpiece with failing articles are directed to the previous process bay 1021 for rework. However, if, for example, an intrabay transportation system which has a separate automation from the stocker 1041 is used for transportation between the stocker 1041 and the metrology or inspection stations 1041b, and the stocker and the interbay transportation system 106, the first workpiece and the second workpiece need to be picked up and dropped off by one or more vehicles of the interbay transportation system 106 multiple times. Both picking up and dropping off incur wait time. By integrating the metrology or inspection operation into the automation of the stocker 1041, the wait times for the vehicle pick up and drop off the articles are eliminated.

The AMHS 10 in FIG. 1 is a central corridor configuration and is exemplary. Other configurations of AHMS 10 such as a configuration with an interbay transportation system surrounding the process bays are within the contemplated scope of the present disclosure.

Figure 2:
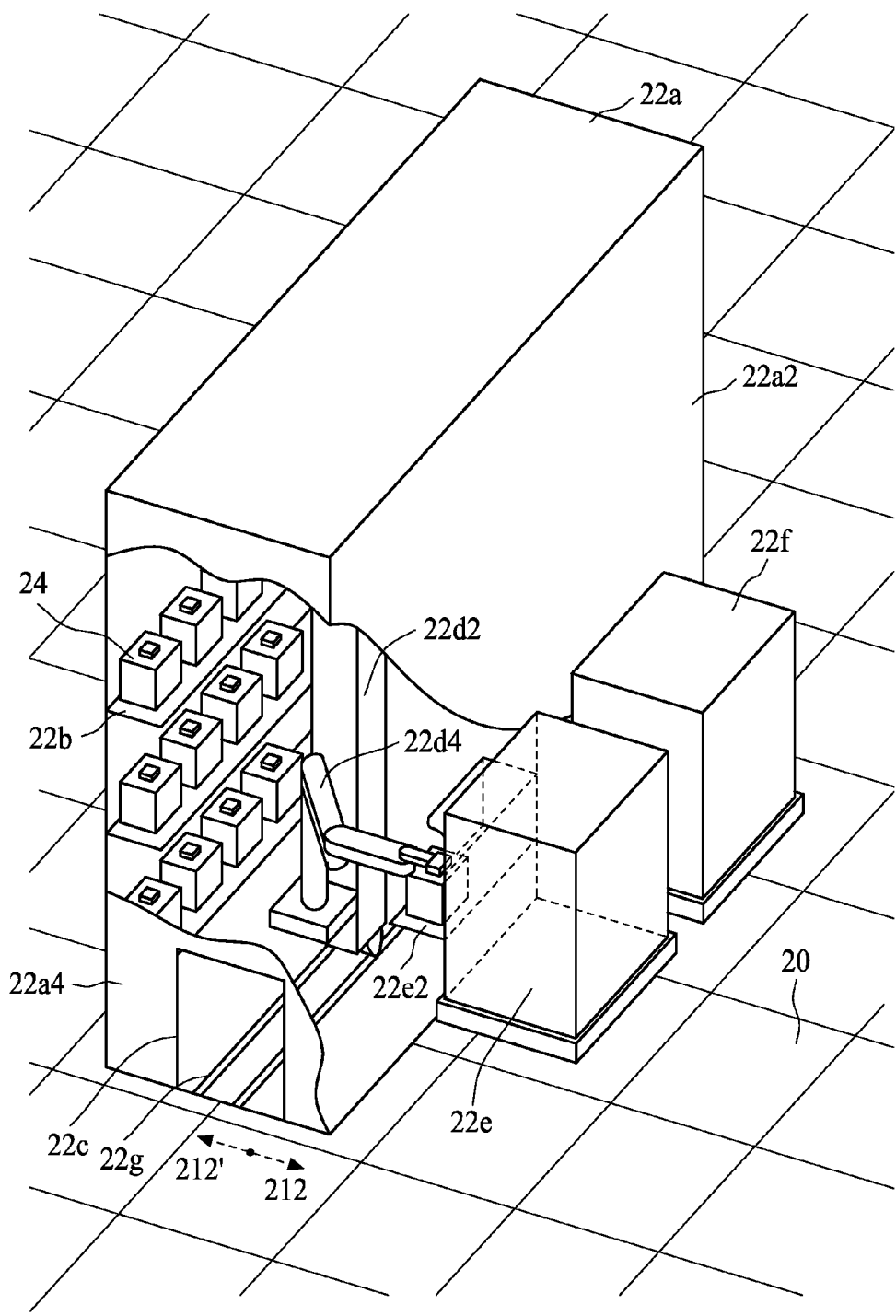
FIG. 2 is a schematic perspective view diagram of a stocker with embedded stations in accordance with some embodiments.

FIG. 2 is a schematic perspective view diagram of a stocker 22 with embedded stations in accordance with some embodiments. The stocker 22 is configured to provide automation among storage, retrieval, and operations performed by the embedded stations for workpieces 24. In some embodiments, the stocker 22 includes a main body 22a, a robotic arm mechanism 22d, and several embedded stations 22e and 22f. In some embodiments, the main body 22a includes a longitudinal side wall 22a2, another longitudinal side wall (not shown), a transverse side wall 22a4 and another transverse side wall (not shown) forming a rectangular enclosure. The robotic arm mechanism 22d is configured to move within the rectangular enclosure. In some embodiments, the robotic arm mechanism 22d is a crane 22d2 configured with a robotic arm 22d4. The crane 22d2 and the rail 22d2 are configured to move the robotic arm 22d4 along a length of the longitudinal side wall 22a2. The crane 22d2 is also configured to move the robotic arm 22d4 along a height of the longitudinal side wall 22a2. The length and height of the longitudinal side wall are parallel and perpendicular to a floor 20, respectively. The robotic arm 22d4 is configured to move the workpiece 24 along a plane perpendicular to the longitudinal side wall 22a2.

In some embodiments, the longitudinal side wall 22a2 confines a storage space for the workpiece 24 in a direction 212 parallel to the floor 20, and the robotic arm mechanism 22d confines the storage space in a direction 212' opposite to the direction 212. In some embodiments, a movement of the robotic arm mechanism 22d in parallel to the length and height of the longitudinal side wall 22a2 confines the storage space in the direction 212'. For example, in FIG. 2, the movement of the crane 22d2 along a rail 22g in parallel to the length of the longitudinal side wall 22a2 and along a height of the crane 22d2 in parallel to the height of the longitudinal side wall 22a2 confines the storage space in the direction 212'. Symmetrically, the other longitudinal side wall and the robotic arm mechanism 22d confines another storage space within the rectangular enclosure. In some embodiments, storage shelves 22b are configured on the main body 22a such as on the longitudinal side wall 22a2 and the other longitudinal side wall to facilitate storing of the workpieces 24 within the storage spaces.

In some embodiments, the embedded stations 22e and 22f are configured along the length of the longitudinal side wall 22a2. The station 22e is configured with at least one accessing port 22e2 located within the storage space between the longitudinal side wall 22a2 and the robotic arm mechanism 22d. In some embodiments, the accessing port 22e2 includes an accommodating space for a container of the workpiece 24 during loading and unloading each article in the container. The accommodating space for the container is located within the storage space. Therefore, the robotic arm mechanism 22d can place or retrieve the workpiece 24 to and from the accessing port 22e2 in a manner similar to placing or retrieving the workpiece 24 to and from any other place in the storage space. The station 22f has an accessing port configured similarly to that of the station 22e and is omitted here.

The accessing port 22e2 of the station 22e is exemplary. Other configurations such as separate loading and unloading ports for loading and unloading an article of the workpiece 24, respectively, and the accommodating space located partially within the storage space are within the contemplated scope of the present disclosure. The number of stations embedded into the stocker 22 is also exemplary. Other numbers of stations embedded into the stocker 22 are within the contemplated scope of the present disclosure.

In some embodiments, an accessing port 22c of the stocker 22 is located on the transverse side wall 22a4. Through the accessing port 22c, the workpiece 24 is received by the stocker 22 or sent out from the stocker 22. In some embodiments, the accessing port 22c is an interface location between the stocker 22 and the interbay transportation system 106 in FIG. 1. The robotic arm mechanism 22d picks up the workpiece 24 from or drops off the workpiece 24 to the vehicle of the interbay transportation system 106 at the accessing port 22c.

The accessing port 22c of the stocker 22 is exemplary. Other configurations such as separate loading and unloading ports for loading and unloading the workpiece 24, respectively, different locations of the accessing port on the main body 22a of the stocker 22 are within the contemplated scope of the present disclosure.

Figure 3:
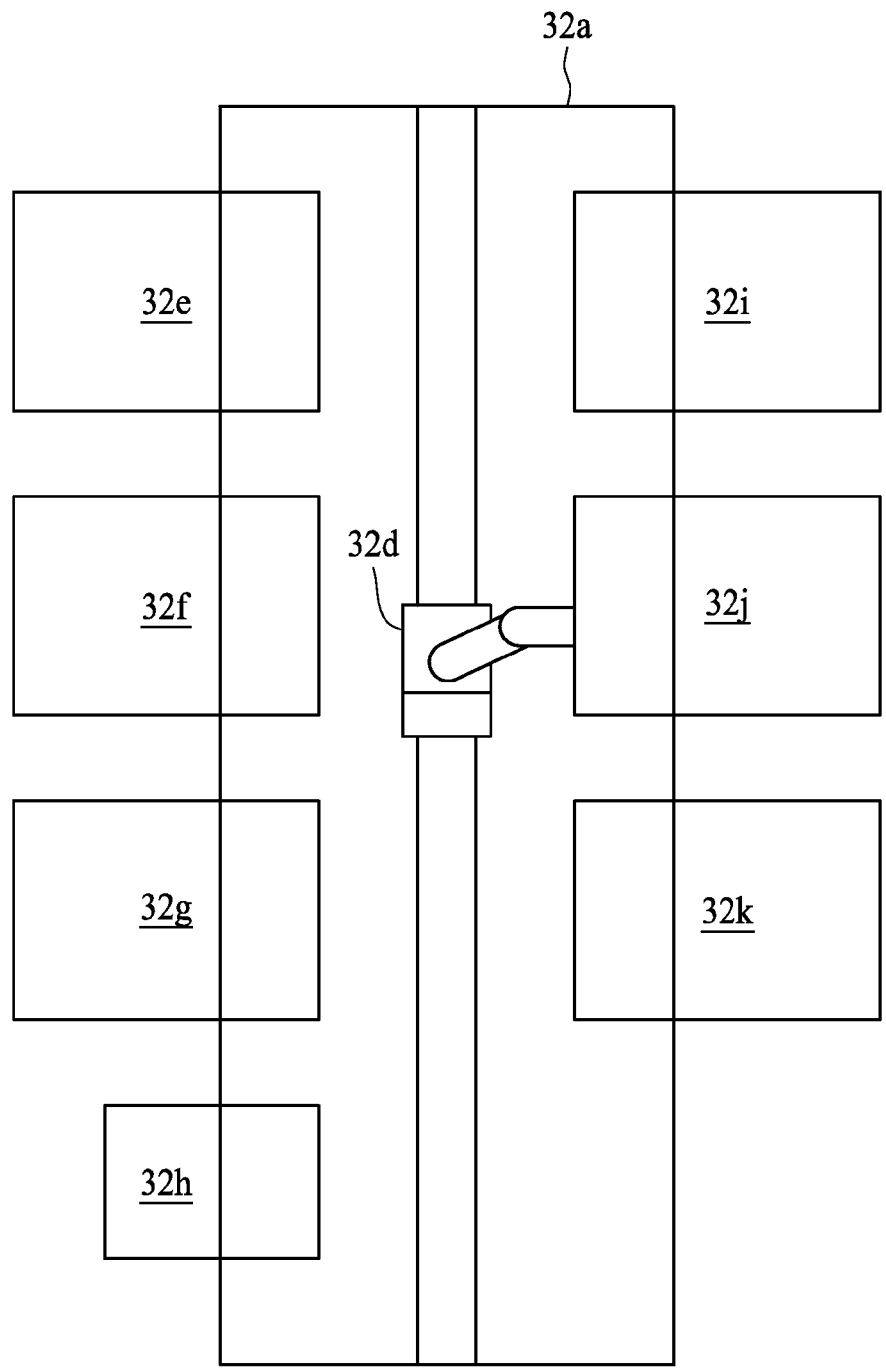
FIG. 3 is a schematic top view diagram of a stocker with embedded metrology or inspection stations for wafers in accordance with some embodiments.

FIG. 3 is a schematic top view diagram of a stocker 32 with embedded metrology or inspection stations for wafers in accordance with some embodiments. The stocker 32 is configured to provide automation among storage, retrieval and several metrology or inspection routines for workpieces in a semiconductor device fabrication process flow. The workpiece includes a wafer lot, a cassette holding the wafer lot, and a wafer pod holding the cassette. In some embodiments, the wafer pod is a Front Opening Unified Pod (FOUP). In other embodiments, the wafer pod is a Standard Mechanical Interface (SMIF) pod. The stocker 32 includes a main body 32a, a robotic arm mechanism 32d, a particle detection station 32e, a defect detection station 32f, a film thickness measurement station 32g, a sorter 32h, a pod cleaning station 32i, a critical dimension measurement station 32j and an overlay measurement station 32k. The main body 32a, the robotic arm mechanism 32d, and the embedded stations 32e, 32f, . . . , and 32k of the stocker 32 are configured in a manner similar to those described with reference to FIG. 2.

Figure 4:
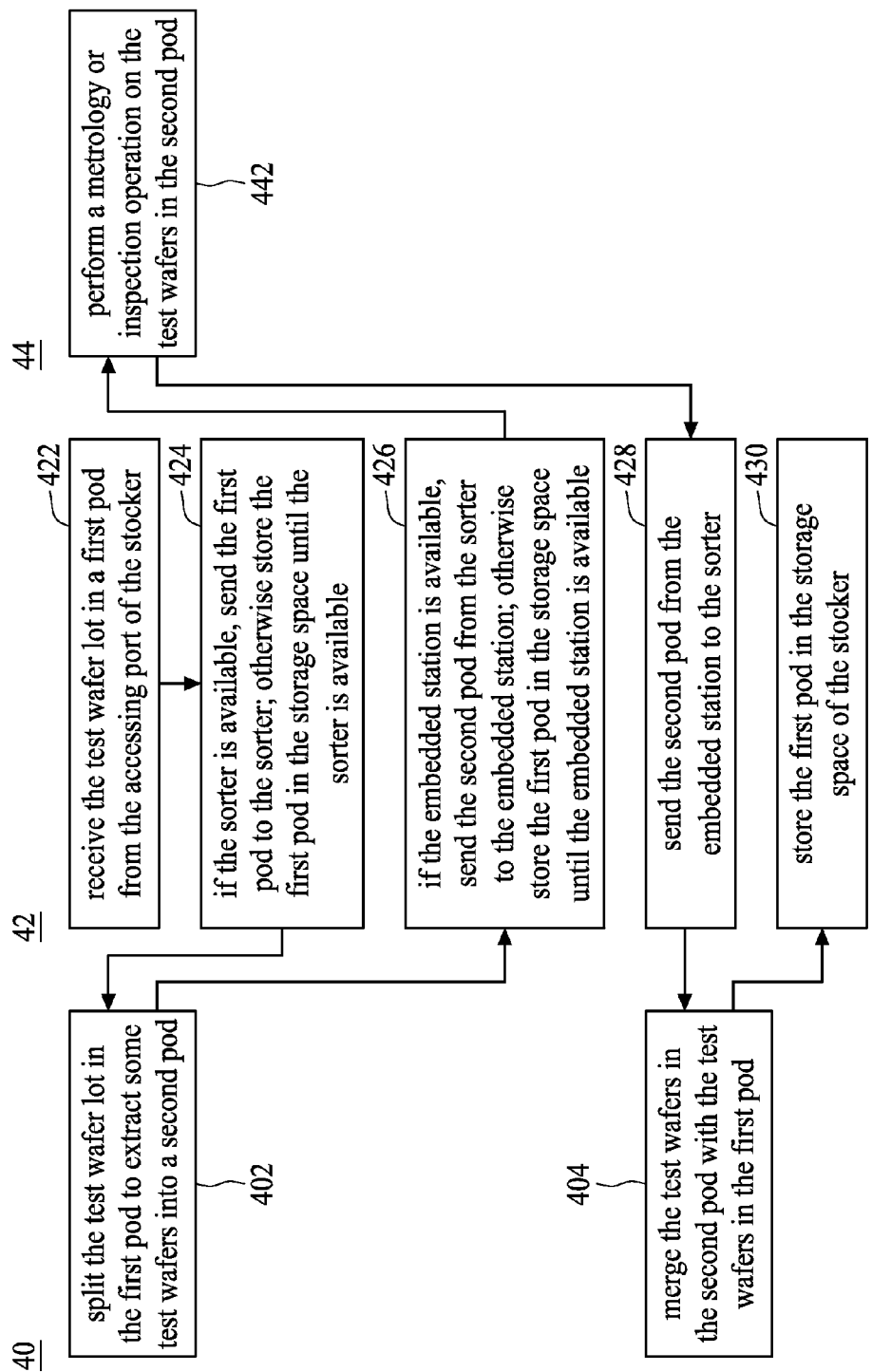
FIG. 4 is a flow chart of the metrology or inspection routine performed by the stocker for a wafer pod that contains a test wafer lot in accordance with some embodiments.

In some embodiments, the stocker 32 is self-contained in performing some metrology or inspection routines for the semiconductor device fabrication process flow. FIG. 4 is a flow chart of the metrology or inspection routine performed by the stocker 32 for a wafer pod that contains a test wafer lot in accordance with some embodiments. Test wafers are used to monitor integrity of a work station to be used in a semiconductor device fabrication process flow. In some embodiments, testing of the work station using the test wafers are done separately from the semiconductor device fabrication process flow. Operation sequence 40 includes operations performed by the sorter 32h. Operation sequence 42 includes operations performed by the robotic arm mechanism 32d. Operation sequence 44 includes an operation performed by the embedded station 32e, 32f, 32g, 32i, 32j or 32k. The particle detection operation performed by the station 32e or the station 32f is used frequently during testing of the work station using test wafers, and is therefore used to describe some embodiments below.

In operation 422 in the operation sequence 42, the robotic arm mechanism 32d receives a test wafer lot in a first pod from the accessing port (not shown) of the stocker 32. The test wafer lot has been processed by a work station before being sent to the stocker 32. In operation 424, if the sorter 32h is available, the robotic arm mechanism 32d sends the first pod to the sorter 32h; otherwise, the robotic arm mechanism 32d sends the first pod to the storage space for storing the first pod until the sorter 32h is available, and sends the first pod to the sorter 32h. Then, in operation 402 in the operation sequence 40, the sorter 32h splits the test wafer lot in the first pod to extract some test wafers into a second pod. Then, in operation 426 in the operation sequence 42, if the station 32e is available, the robotic arm mechanism sends the second pod from the sorter 32h to the station 32e; otherwise, the robotic arm mechanism 32d sends the first pod to the storage space for storage to store the first pod until the station 32h is available, and sends the first pod to the station 32e. Then, in operation 442 in the operation sequence 44, the station 32e performs a metrology or inspection operation on the test wafers in the second pod and generates a result for calibrating or maintaining the work station. Then, in operation 428 in the operation sequence 42, the robotic arm mechanism 32d sends the second pod from the station 32e to the sorter 32h. Then, in operation 404 in the operation sequence 40, the sorter 32h merges the test wafers in the second pod with the test wafers in the first pod. Then, in operation 430 in the operation sequence 42, the robotic arm mechanism 32d stores the first pod in the storage space of the stocker 32.

Because the stocker 32 provides integrated automation among storage, retrieval, extraction of some test wafers for the metrology or inspection operation, and the metrology or inspection operation, the stocker 32 is self-contained in performing the routine for monitoring the integrity of the work station. Further, wait times for a vehicle to pick up and drop off the first pod and the second pod when they are transported between the stocker 32 and the interbay transportation system 106 in FIG. 1, and between the stocker 32 and the station 32e are eliminated.

Figure 5:
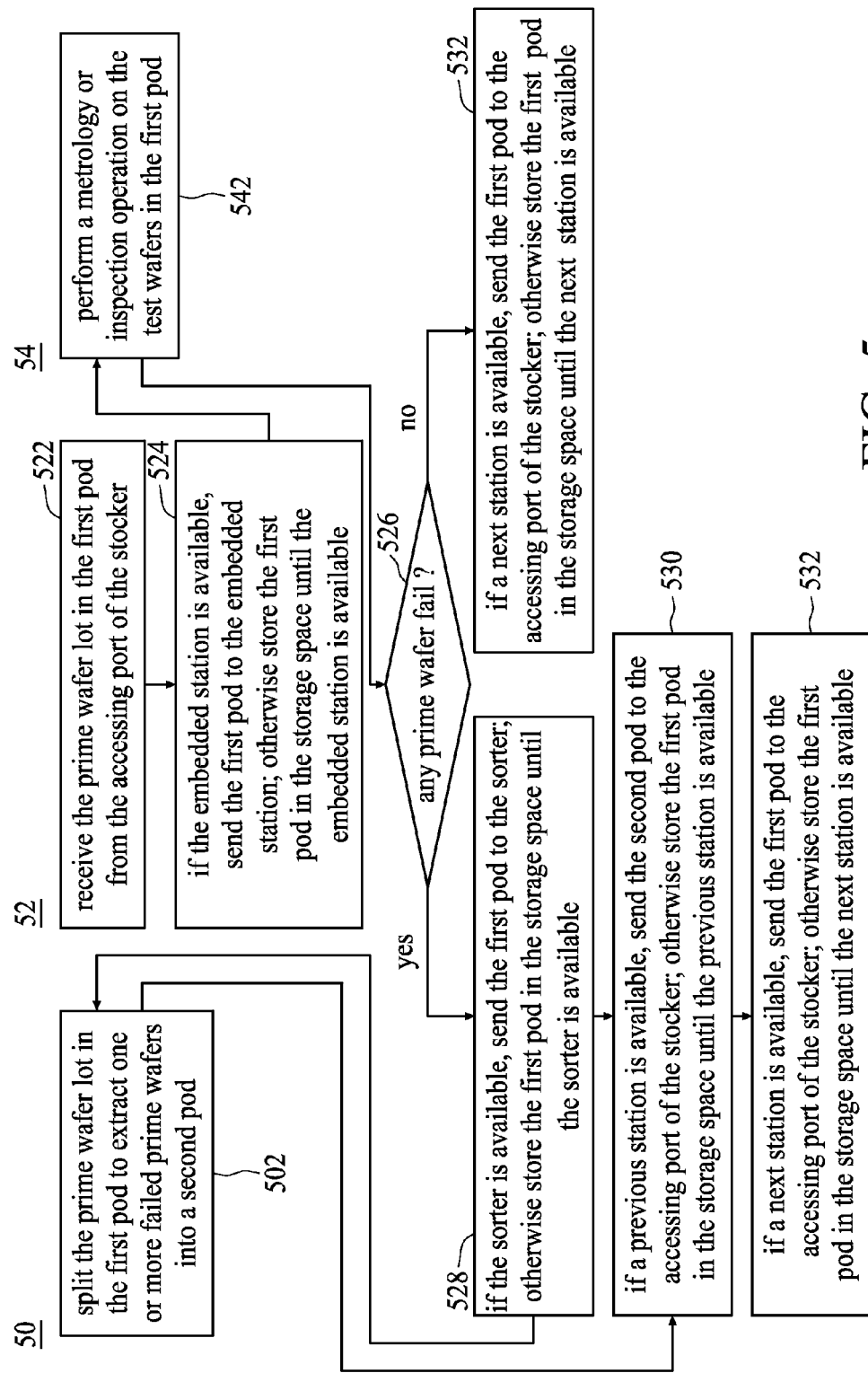
FIG. 5 is a flow chart of the metrology or inspection routine performed by the stocker for a wafer pod that contains a prime wafer lot in accordance with some embodiments.

FIG. 5 is a flow chart of the metrology or inspection routine performed by the stocker 32 for a wafer pod that contains a prime wafer lot in accordance with some embodiments. Prime wafers are WIP wafers in the semiconductor device fabrication process flow. Operation sequence 50 includes operations performed by the sorter 32h. Operation sequence 52 includes operations performed by the robotic arm mechanism 32d and by a dispatching system controlling the robotic arm mechanism 32d. Operation sequence 54 includes an operation performed by the integrated station 32e, 32f, 32g, 32i, 32j or 32k. The overlay measurement operation performed by the station 32k is used frequently during the semiconductor device fabrication process flow and is therefore used to describe some embodiments below.

In operation 522 in the operation sequence 52, the robotic arm mechanism 32d receives a prime wafer lot in a first pod from the accessing port of the stocker 32. In operation 524, if the station 32k is available, the robotic arm mechanism 32d sends the first pod to the station 32k; otherwise, the robotic arm mechanism 32d sends the first pod to the storage space for storing the first pod until the station 32k is available, and sends the first pod to the station 32k. Then, in operation 542 in the operation sequence 54, the station 32k performs a metrology or inspection operation on the prime wafers in the first pod. Then, in operation 526 in the operation sequence 52, the dispatching system of the robotic arm mechanism 32d checks if any prime wafer fails based on the results of the station 32k. If so, the robotic arm mechanism 32d is instructed to perform the operation 528 on the "yes" path; otherwise, the robotic arm mechanism 32d is instructed to perform the operation 532 on the "no" path. In operation 528, if the sorter 32h is available, the robotic arm mechanism 32d sends the first pod to the sorter 32d; otherwise, the robotic arm mechanism 32d sends the first pod to the storage space for storing the first pod until the sorter 32h is available, and sends the first pod to the sorter 32h. Then, in operation 502 in the operation sequence 50, the sorter 32h splits the prime wafer lot in the first pod to extract failed prime wafers into a second pod. Then, in operation 530 in the operation sequence 52, if a previous station for performing rework on the failed prime wafers is available, the robotic arm mechanism 32d sends the second pod to the accessing port of the stocker; otherwise, the robotic arm mechanism 32d sends the second pod to the storage space for storing the second pod until the previous station is available, and sends the second pod to the accessing port. In operation 532, if a next station for further processing the passed prime wafers is available, the robotic arm mechanism 32d sends the first pod to the accessing port of the stocker; otherwise, the robotic arm mechanism 32d sends the first pod to the storage space for storing the first pod until the next station is available, and sends the first pod to the accessing port. On the other hand, in operation 532, if the next station is available, the robotic arm mechanism 32d sends the first pod to the accessing port of the stocker; otherwise, the robotic arm mechanism 32d sends the first pod to the storage space for storing the first pod until the next station is available, and sends the first pod to the accessing port.

Because the stocker 32 provides integrated automation among storage, retrieval, the metrology or inspection operation, and splitting the passed and failed prime wafers based on results of the metrology or inspection operation, the stocker 32 is self-contained in performing the metrology or inspection routine for determining the quality of the prime wafer lot. Further, wait times for a vehicle to pick up and drop off the first pod and the second pod when they are transported between the stocker 32 and the interbay transportation system 106 in FIG. 1, and between the stocker 32 and the station 32k are eliminated.

In some embodiments, the stocker 32 performs a cleaning routine for the semiconductor device fabrication process flow. After the wafer pod containing the prime wafer lot is processed by a station, the wafer pod is sent to the stocker 32 for cleaning. The robotic arm mechanism 32d receives the wafer pod through the accessing port, and sends the wafer pod to the station 32i if the station 32i is available; otherwise, the robotic arm mechanism 32d sends the wafer pod to the storage space for storing the wafer pod until the station 32i is available, and sends the wafer pod to the station 32i. Then, the station 32i performs pod cleaning on the wafer pod. Then, the robotic arm mechanism 32d sends the wafer pod to the accessing port if a next work station is available; otherwise, the robotic arm mechanism 32d sends the wafer pod to the storage space for storing the wafer pod until the next work station is available, and sends the wafer pod to the accessing port. Similar to the metrology or inspection operation, because the stocker 32 provides integrated automation among storage, retrieval and the cleaning operation, wait times for a vehicle to pick up and drop off the wafer pod when it is transported between the stocker 32 and the interbay transportation system 106 in FIG. 1, and between the stocker 32 and the station 32i are eliminated.

Figure 6:
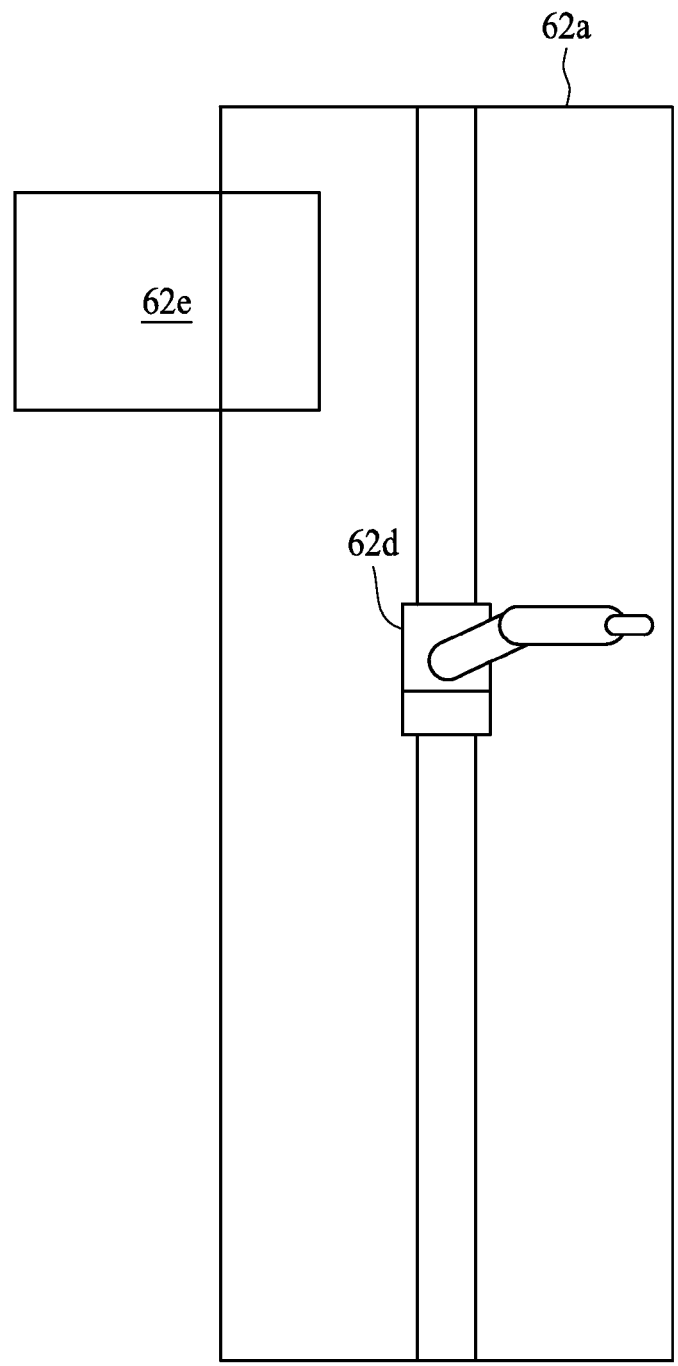
FIG. 6 is a schematic top view diagram of a stocker with embedded metrology or inspection stations for photomasks or reticles in accordance with some embodiments.

FIG. 6 is a schematic top view diagram of a stocker 62 with embedded metrology or inspection stations for photomasks or reticles in accordance with some embodiments. The stocker 32 is configured to provide automation among storage, retrieval, and a metrology or inspection routines for workpiece in a semiconductor device fabrication process flow. The workpiece includes a photomask or a reticle, and a mask pod for holding the photomask or reticle. The stocker 62 includes a main body 62a, a robotic arm mechanism 62 and an embedded mask scan station 62e. The main body 62a, the robotic arm mechanism 62d and the station 62e of the stocker 62 are configured in a manner similar to those described with reference to FIG. 6.

Figure 7:
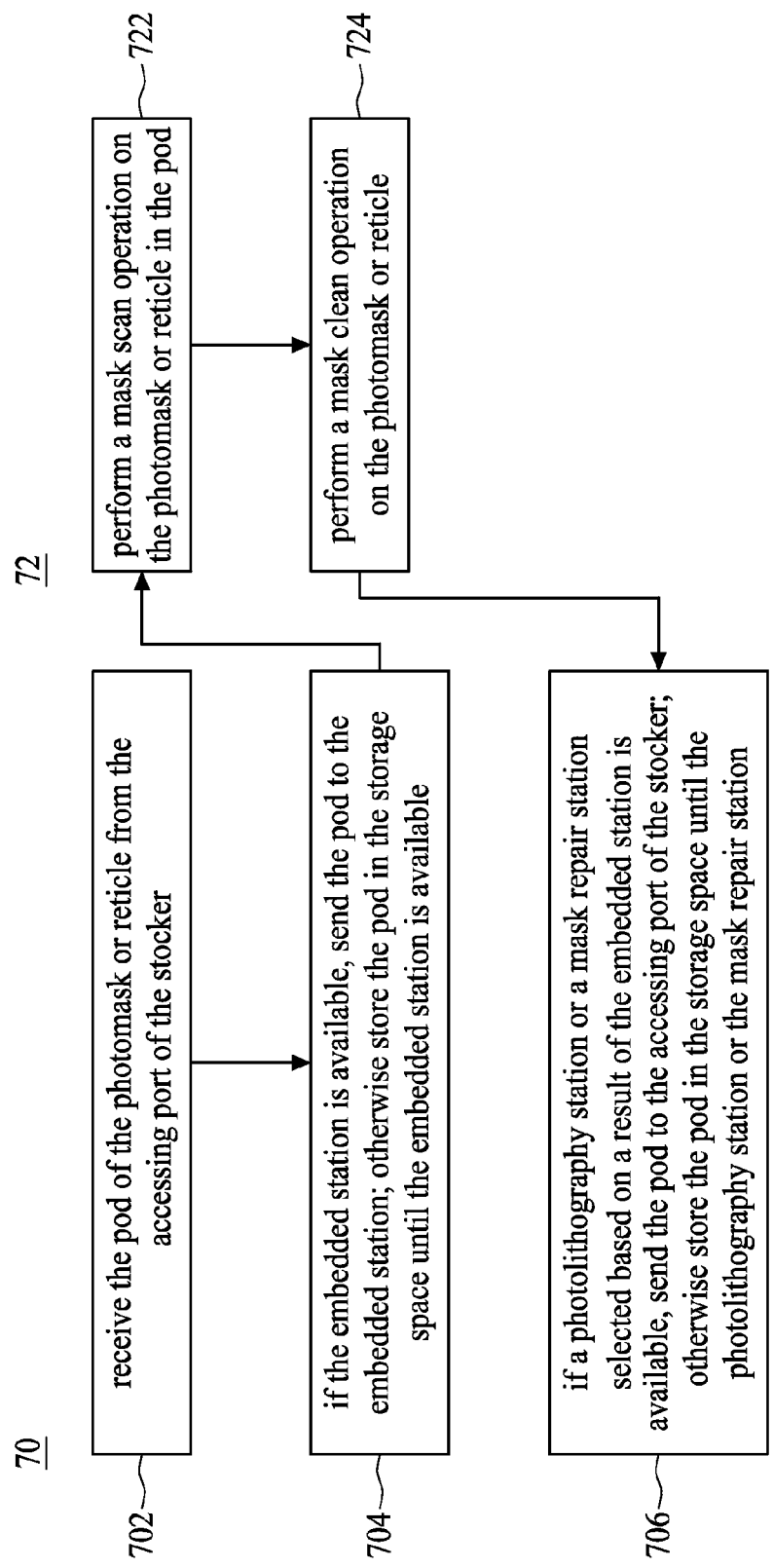
FIG. 7 is a flow chart of the metrology or inspection routine performed by the stocker for a mask pod that contains a photomask or a reticle in accordance with some embodiments.

In some embodiments, the stocker 62 is self-contained in performing a metrology or inspection routine for the semiconductor device fabrication process flow. FIG. 7 is a flow chart of the metrology or inspection routine performed by the stocker 62 for a mask pod that contains a photomask or a reticle in accordance with some embodiments. A photomask or a reticle is used in a photolithography process operation of the semiconductor device fabrication process flow. The metrology or inspection routine is performed each time the mask pod is sent into the stocker 62 or retrieved from the stocker 62. Operation sequence 70 includes operations performed by the robotic arm mechanism 62d. Operation sequence 72 includes operations performed by the station 62e.

In operation 702 in the operation sequence 70, the robotic arm mechanism 62d receives a pod of a photomask or a reticle from an accessing port of the stocker 62. In operation 704, if the station 62e is available, the robotic arm mechanism 62d sends the pod to the station 62e; otherwise, the robotic arm mechanism 62d sends the pod to the storage space for storing the pod until the station 62e is available, and sends the pod to the station 62e. Then, in operation 722 in the operation sequence 72, the station 62e performs a mask scan operation on the photomask or reticle in the pod. In operation 724, the station 62e performs a mask clean operation on the photomask or reticle. Then, in operation 706 in the operation sequence 70, if a photolithography station or a mask repair station selected based on a result of the station 62e is available, the robotic arm mechanism 62d sends the pod to the accessing port of the stocker; otherwise, the robotic arm mechanism 62d sends the pod to the storage space for storing the pod until the photolithography station or the mask repair station is available.

Because the stocker 62 provides integrated automation among storage, retrieval, the metrology or inspection operation, and forwarding the pod depending on the result of the metrology or inspection operation, the stocker 62 is self-contained in performing the metrology or inspection routine each time the mask pod is send into the stocker 62 or retrieved from the stocker 62. Further, wait times for a vehicle to pick up and drop off the pod when it is transported between the stocker 62 and the interbay transportation system 106 in FIG. 1, and between the stocker 62 and the station 62e are eliminated.

Figure 8:
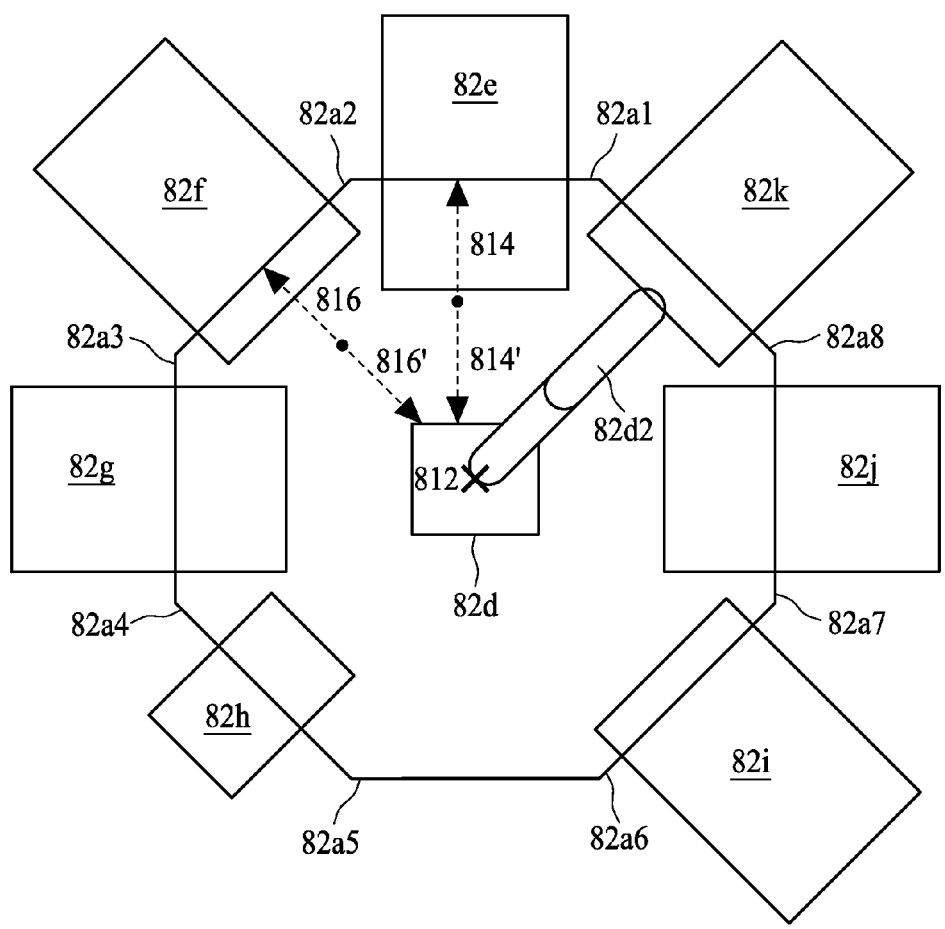
FIG. 8 is a schematic top view diagram of a stocker with embedded metrology or inspection for wafers in accordance with some embodiments.

FIG. 8 is a schematic top view diagram of a stocker 82 with embedded metrology or inspection for wafers in accordance with some embodiments. Compared to the stocker 32 in FIG. 3, the stocker 82 in FIG. 8 has a main body 82a including eight side walls 82a1, 82a2, . . . , and 82a8 that form an octagonal enclosure. Further, in some embodiments, a robotic arm mechanism 82d of the stocker 82 has a fixed location located at a center 812 of the octagonal enclosure. The robotic arm mechanism 82d is configured to move a robotic arm 82d2 along a height of the side walls 82a1, 82a2, . . . , and 82a8, and the robotic arm is configured to move a workpiece between the center 812 and eight side walls 82a1, 82a2, . . . , and 82a8.

In some embodiments, the side wall 82a1 confines a storage space for the workpiece in a direction 814 parallel to a floor (not labeled), and the robotic arm mechanism 82d confines the storage space in a direction 814' opposite to the direction 814. In some embodiments, a movement of the robotic arm mechanism 82d in parallel to the height of the side walls 82a1 confines the storage space in the direction 814'. The side wall 82a2 confines another storage space for the workpiece in a direction 816 parallel to the floor, and the robotic arm mechanism 82d confines the storage space in a direction 816' opposite to the direction 816. Similarly, other side walls 82a3, . . . , and 82a8 confines other storage spaces within the octagonal enclosure. Storage shelves can be configured in the storage spaces similarly to those described with reference to FIG. 2.

In some embodiments, the embedded stations 82e, 82f, . . . , and 82k are configured at the side walls 82a1, 82a2, 82a3, 82a4, 82a6, 82a7, 82a8, respectively. Each station 82e, 82f, . . . , or 82k is configured with at least one accessing port (not shown) located within the storage space between the respective side wall 82f, . . . , or 82k and the robotic arm mechanism 82d. In some embodiments, an accessing port (not shown) of the stocker 82 is located on the side wall 82a5. The embedded stations 82e, 82f, . . . , and 82k, and the accessing port of the stocker 82 are similar to the embedded stations 22e, 22f, . . . , and 22k, and the accessing port 22c of the stocker 22 described with reference to FIGS. 2 and 3, and details of which are omitted here. Further, the stocker 82 can be similarly configured to perform the metrology or inspection routines, or the cleaning routine described with reference to FIGS. 3, 4 and 5.

In some embodiments, an automated storage and retrieval system (ASRS) for storing workpieces includes a main body, a robotic arm mechanism and at least one first station. The workpiece comprises a first container configured to hold at least one article. The main body includes at least one side wall configured to confine a storage space for the workpieces in at least one first direction parallel to a floor. The robotic arm mechanism is configured to reach the storage space, the storage space being further confined by the robotic arm mechanism in at least one second direction opposite to the at least one first direction. The at least one first station is configured with at least one first accessing port located within the storage space, and configured for the ASRS to perform a routine for a process flow.

In some embodiments, a stocker for storing workpieces includes a main body, a robotic arm mechanism and at least one first station. The workpiece comprises a first container configured to hold at least one article. The main body includes at least one side wall configured to confine a storage space for the workpieces in at least one first direction parallel to a floor. The robotic arm mechanism is configured to reach the storage space, the storage space being further confined by the robotic arm mechanism in at least one second direction opposite to the at least one first direction. The at least one first station is configured with at least one first accessing port located within the storage space, and configured to perform a metrology or inspection operation on the at least one article in the workpiece.

In some embodiments, in a method, a first workpiece from a loading port of a stocker is received. The first workpiece includes a first container holding at least one article. The first workpiece is moved to a first station or a storage space in the stocker using a robotic arm mechanism of the stocker depending on an availability of the first station. A metrology or inspection operation is performed on the at least one article at the first station. The first workpiece is moved from the first station to an unloading port or the storage space depending on the availability of a next processing station.

The above description includes exemplary operations, but these operations are not necessarily required to be performed in the order shown. Operations may be added, replaced, changed order, and/or eliminated as appropriate, in accordance with the spirit and scope of the disclosure. Accordingly, the scope of the disclosure should be determined with reference to the following claims, along with the full scope of equivalents to which such claims are entitled.

What is claimed is:

1. An automated storage and retrieval system (ASRS) for storing workpieces, wherein the workpiece comprises a first container configured to hold at least one article, the ASRS comprising:
a main body comprising at least one side wall configured to confine a storage space for the workpieces in at least one first direction parallel to a floor;
a robotic arm mechanism configured to reach the storage space, the storage space being further confined by the robotic arm mechanism in at least one second direction opposite to the at least one first direction;
at least one first station, the first station configured with at least one first accessing port located within the storage space, and configured for the ASRS to perform a routine for a process flow,
wherein the at least one first station is configured for the ASRS to perform a metrology or inspection routine for a process flow; and
a second station, configured with at least one second accessing port located within the storage space, and configured to extract some of articles from a first workpiece to a second workpiece,
wherein the robotic arm mechanism is configured to move the second workpiece from the second station to the first station, and/or move the first workpiece from the first station to the second station.

2. The ASRS of claim 1, wherein
the ASRS is self-contained in performing the metrology or inspection routine for the process flow.

3. The ASRS of claim 1, wherein
the article is a wafer; and
the at least one first station is selected from a group consisting of a particle detection equipment, and an overlay measurement equipment.

4. The ASRS of claim 1, wherein
the main body comprises longitudinal sidewalls and transverse sidewalls connecting the longitudinal sidewalls;
the at least one first station is embedded in the longitudinal sidewalls; and
the stocker further comprises:
at least one accessing port of the ASRS located on one of the transverse side walls.

5. A stocker for storing workpieces, wherein the workpiece comprises a first container configured to hold at least one article, the stocker comprising:
a main body comprising at least one side wall configured to confine a storage space for the workpieces in at least one first direction parallel to a floor;
a robotic arm mechanism configured to reach the storage space, the storage space being further confined by the robotic arm mechanism in at least one second direction opposite to the at least one first direction; and
at least one first station, the first station configured with at least one first accessing port located within the storage space and not configured with any accessing port which is accessed by another transporting mechanism not configured to directly reach the storage space, and configured to perform a metrology or inspection operation on the at least one article in the workpiece.

6. The stocker of claim 5, wherein
the article is a wafer; and
the at least one first station is selected from the group consisting of a particle detection equipment, and an overlay measurement equipment.

7. The stocker of claim 6, wherein
the article is a prime wafer; and
the at least one first station comprises the overlay measurement equipment.

8. The stocker of claim 6, wherein
the article is a test wafer; and
the at least one first station comprises the particle measurement equipment.

9. The stocker of claim 5, wherein
the article is a photomask or a reticle; and
the at least one first station comprises a mask scan equipment.

10. The stocker of claim 5, wherein
the stocker further comprises:
a second station, configured with at least one second accessing port located within the storage space, and configured to extract some of articles from a first workpiece to a second workpiece; and
the robotic arm mechanism is configured to move the second workpiece from the second station to the first station, and/or move the first workpiece from the first station to the second station.

11. The stocker of claim 5, wherein
the main body comprises longitudinal sidewalls and transverse sidewalls connecting the longitudinal sidewalls;
the at least one first station is embedded in the longitudinal sidewalls; and the stocker further comprises:
at least one stocker accessing port located on one of the transverse side walls.

12. A method, comprising:
receiving a first workpiece from a loading port of a stocker, the first workpiece comprising a first container holding at least one article;
moving the at least one article to a first station in the stocker using a robotic arm mechanism of the stocker;
performing a metrology or inspection operation on the at least one article at the first station; and
moving the at least one article from the first station to an unloading port of the stocker or the storage space by the robotic arm mechanism,
wherein between the operation of moving the at least one article to the first station using the robotic arm mechanism and the operation of moving the at least one article from the first station to the unloading port or the storage space by the robotic arm mechanism, the at least one article is not moved by any other transporting mechanism not configured to directly reach the storage space.

13. The method of claim 12, wherein
the article is a test wafer; and
the metrology or inspection operation is a particle measuring operation.

14. The method of claim 12, wherein
the article is a prime wafer; and
the metrology or inspection operation is an overlay measuring operation.

15. The method of claim 12, wherein
the article is a photomask or a reticle; and
the metrology or inspection operation is a mask scan operation.

16. The method of claim 12, wherein
the article is a test wafer; and
moving the at least one article to the first station in the stocker using the robotic arm mechanism comprises:
moving the first workpiece from the loading port to a second station or the storage space using the robotic arm mechanism depending on an availability of the second station; and
extracting the at least one article in the first workpiece to a second workpiece at the second station,
wherein the second workpiece comprises a second container holding the at least one article; and
moving the second workpiece to the first station or the storage space using the robotic arm mechanism depending on the availability of the first station.

17. The method of claim 12, wherein
the article is a prime wafer;
moving the at least one article to the first station in the stocker using the robotic arm mechanism comprises:
moving the first work piece from the loading port to the first station or the storages space using the robotic arm mechanism depending on the availability of the first station;
moving the at least one article from the first station to the unloading port of the stocker or the storage space by the robotic arm mechanism comprises:
moving the first workpiece from the first station to a second station or the storage space using the robotic arm mechanism after the metrology or inspection operation depending on an availability of the second station; and
extracting the at least one article in the first workpiece to a second workpiece at the second station,
wherein the second workpiece comprises a second container holding the at least one article; and
moving the second workpiece from the second station to the unloading port or the storage space depending on an availability a previous processing station.

18. The method of claim 12, wherein
the article is a prime wafer;
moving the at least one article to the first station in the stocker using the robotic arm mechanism comprises:
moving the first workpiece from the loading port to the first station or the storage space using the robotic arm mechanism depending on the availability of the first station;
moving the at least one article from the first station to the unloading port of the stocker or the storage space by the robotic arm mechanism comprises:
moving the first workpiece from the first station to the unloading port or the storage space depending on availability of a next processing station.

* * * * *